(12) United States Patent
Sutardja

(10) Patent No.: US 10,761,737 B2
(45) Date of Patent: Sep. 1, 2020

(54) METHOD AND APPARATUS FOR CACHING DATA IN AN SOLID STATE DISK (SSD) OF A HYBRID DRIVE THAT INCLUDES THE SSD AND A HARD DISK DRIVE (HDD)

(71) Applicant: Marvell World Trade LTD., St. Michael (BB)

(72) Inventor: Sehat Sutardja, Los Altos Hills, CA (US)

(73) Assignee: MARVELL ASIA PTE, LTD., Singapore (SG)

(*) Notice: Subject to any disclaimer, the term of this patent is extended or adjusted under 35 U.S.C. 154(b) by 90 days.

(21) Appl. No.: 16/119,182

(22) Filed: Aug. 31, 2018

(65) Prior Publication Data

US 2018/0373442 A1 Dec. 27, 2018

Related U.S. Application Data

(63) Continuation of application No. 15/676,395, filed on Aug. 14, 2017, now Pat. No. 10,067,687, which is a
(Continued)

(51) Int. Cl.
*G06F 3/06* (2006.01)
*G06F 12/0866* (2016.01)
(Continued)

(52) U.S. Cl.
CPC .......... *G06F 3/0611* (2013.01); *G06F 3/0644* (2013.01); *G06F 3/0656* (2013.01);
(Continued)

(58) Field of Classification Search
None
See application file for complete search history.

(56) References Cited

U.S. PATENT DOCUMENTS 6,378,037 B1 * 4/2002 Hall .................... G06F 11/1441
711/112
6,795,894 B1 9/2004 Neufeld et al.
(Continued)

FOREIGN PATENT DOCUMENTS

WO   WO-9637844 A1    11/1996
WO   WO-2008055272 A2  5/2008

OTHER PUBLICATIONS

Patterson et al. Computer Organization and Design: The Hardware/Software Interface. Oct. 2013. Morgan Kaufmann. 5th ed. pp. 374-398.*
(Continued)

*Primary Examiner* — Nathan Sadler (57) ABSTRACT

A system includes a read/write module and a caching module. The read/write module is configured to access a first portion of a recording surface of a rotating storage device. Data is stored on the first portion of the recording surface of the rotating storage device at a first density. The caching module is configured to cache data on a second portion of the recording surface of the rotating storage device at a second density. The second portion of the recording surface of the rotating storage device is separate from the first portion of the recording surface of the rotating storage device. The second density is less than the first density.

7 Claims, 6 Drawing Sheets

Related U.S. Application Data continuation of application No. 15/204,368, filed on Jul. 7, 2016, now Pat. No. 9,733,841, which is a continuation of application No. 14/702,078, filed on May 1, 2015, now Pat. No. 9,454,991.

(60) Provisional application No. 61/987,947, filed on May 2, 2014.

(51) Int. Cl.

| | |
|---|---|
| *G06F 12/0897* | (2016.01) |
| *G11B 20/10* | (2006.01) |
| *G11B 20/12* | (2006.01) |
| *G11B 5/55* | (2006.01) |
| *G11B 19/04* | (2006.01) |
| *G11B 20/18* | (2006.01) |
| *G11B 27/36* | (2006.01) |
| *G11C 15/04* | (2006.01) |

(52) U.S. Cl.
CPC ........ *G06F 3/0676* (2013.01); *G06F 12/0866* (2013.01); *G06F 12/0897* (2013.01); *G11B 5/5526* (2013.01); *G11B 19/041* (2013.01); *G11B 19/047* (2013.01); *G11B 20/10527* (2013.01); *G11B 20/1217* (2013.01); *G11B 20/1252* (2013.01); *G11B 20/1879* (2013.01); *G11B 27/36* (2013.01); *G06F 2212/1016* (2013.01); *G06F 2212/1024* (2013.01); *G06F 2212/202* (2013.01); *G06F 2212/21* (2013.01); *G06F 2212/217* (2013.01); *G06F 2212/224* (2013.01); *G06F 2212/225* (2013.01); *G06F 2212/281* (2013.01); *G06F 2212/282* (2013.01); *G06F 2212/313* (2013.01); *G06F 2212/462* (2013.01); *G06F 2212/70* (2013.01); *G11B 2020/10657* (2013.01); *G11B 2020/1238* (2013.01); *G11B 2020/1242* (2013.01); *G11B 2020/1292* (2013.01); *G11B 2020/183* (2013.01); *G11C 15/043* (2013.01)

(56) References Cited

U.S. PATENT DOCUMENTS

| | | | |
|---|---|---|---|
| 6,978,355 | B2 | 12/2005 | Mowery et al. |
| 7,263,651 | B2 | 8/2007 | Xia et al. |
| 7,428,617 | B2 | 9/2008 | Okawa et al. |
| 7,800,856 | B1 | 9/2010 | Bennett et al. |
| 8,599,510 | B1 | 12/2013 | Fallone |
| 8,688,900 | B2 | 4/2014 | Eleftheriou et al. |
| 9,129,628 | B1 | 9/2015 | Fallone et al. |
| 9,182,915 | B2 | 11/2015 | Sutardja |
| 9,223,686 | B1* | 12/2015 | Gupta ............... G06F 12/00 |
| 9,323,688 | B2 | 4/2016 | Sutardja |
| 9,454,991 | B2 | 9/2016 | Sutardja |
| 9,477,611 | B2 | 10/2016 | Sutardja |
| 9,559,722 | B1 | 1/2017 | Huang et al. |
| 9,594,693 | B2 | 3/2017 | Sutardja |
| 9,733,841 | B2 | 8/2017 | Sutardja |
| 9,928,172 | B2 | 3/2018 | Sutardja |
| 2005/0257119 | A1 | 11/2005 | Blankenship et al. |
| 2006/0242534 | A1 | 10/2006 | Livshitz |
| 2007/0022362 | A1 | 1/2007 | Yue et al. |
| 2007/0162815 | A1 | 7/2007 | El-Khamy et al. |
| 2008/0294867 | A1 | 11/2008 | Kimura |
| 2010/0211731 | A1* | 8/2010 | Mittendorff ........ G06F 12/0866 711/113 |
| 2011/0307755 | A1 | 12/2011 | Livshitz et al. |
| 2012/0300328 | A1* | 11/2012 | Coker .................. G11B 5/012 360/31 |
| 2013/0227220 | A1* | 8/2013 | Xi ..................... G06F 12/0891 711/133 |
| 2013/0321948 | A1 | 12/2013 | Bandic et al. |
| 2013/0335856 | A1 | 12/2013 | Tanabe et al. |
| 2015/0113214 | A1 | 4/2015 | Sutardja |
| 2015/0242137 | A1 | 8/2015 | Sutardja |
| 2015/0309923 | A1* | 10/2015 | Iwata ..................... G06F 3/064 711/105 |
| 2015/0318022 | A1 | 11/2015 | Sutardja |
| 2016/0371009 | A1* | 12/2016 | Sato ..................... G06F 3/0632 |
| 2017/0177481 | A1 | 6/2017 | Sutardja |

OTHER PUBLICATIONS

U.S. Appl. No. 61/987,947, Sutardja.
U.S. Appl. No. 62/000,657, Huang.
U.S. Appl. No. 62/013,700, Huang.
U.S. Appl. No. 62/013,706, Huang.
U.S. Appl. No. 14/681,485, Huang et al.
U.S. Appl. No. 14/702,078, Sutardja.
U.S. Appl. No. 14/706,335, Huang et al.
U.S. Appl. No. 14/710,988, Sutardja.
U.S. Appl. No. 15/676,395, Sutardja et al.
"Specification of the Bluetooth System" Master Table of Contents & Compliance Requirements—Covered Core Package version: 4.0; Jun. 30, 2010; 2302 pages.
802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.
Gunnam, Kiran, Choi, Gwan, Wang, Weihuang; Mutli-Rate Layered Decoder Architecture for Blaock LDPC Codes of the IEEE 802.11n Wlrless Standard; Department of Electrical and Computer Engineering; 2007; pp. 1645-1648.
Gunnam, Kiran, Choi, Gwan, Wang, Weihuang; Mutli-Rate Layered Decoder Architecture for Block LDPC Codes of the IEEE 802.11n Wireless Standard; Department of Electrical and Computer Engineering; 2007; pp. 1645-1648.
IEEE P802.11 Wireless LANs; Proposed Specification Framework for TGah; Mar. 2012; 13 Pages.
IEEE P802.11ac / D2.0; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Jan. 2012; 359 pages.
IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.
IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.
IEEE P802.11g/D8.2 Draft Supplement to Standard [for] Information Technology—Telecommunications and information exchange between systems—Local and metropolitan area networks—Specific requirements—Part 11: Wireless Lan Medium Access Control (MAC) and Physical Layer (PHY) specifications: Further Higher Data Rate Extension in the 2.4 GHz Band; LAN/MAN Standards Committee of the IEEE Computer Society; Apr. 2003; 69 pages.

(56) References Cited

OTHER PUBLICATIONS

IEEE P802.20™ V14, Draft 802.20 Permanent Document; <System Requirements for IEEE 802.20 Mobile Broadband Wireless Access Systems—Version 14>; Jul. 16, 2004; 24 Pages.
IEEE Std 802.11a-1999 (Supplement to IEEE Std 802.11-1999) Supplement to IEEE Standard for Information technology—Telecommunications and information exchange between systems—Local and metropolitan area networks—Specific requirements—Part11: Wireless LAN Medium Access Control (MAC) and Physical Layer (PHY) specifications: High-Speed Physical Layer in the 5 Ghz Band; LAN/MAN Standards Committee of the IEEE Computer Society; Sep. 16, 1999; 91 pages.
IEEE Std 802.11b-1999/ Cor 1-2001; IEEE Standard for Information Technology—Telecommunications and informaiton exchange between systems—Local and metropolitan area networks—Specific requirements; Part 11: Wireless LAN Medium Access Control (MAC) and Physical Layer (PHY) specifiations; Amendment 2: Higher-Speed Phsycial Layer (PHY) extension in the 2.4 GHz Band—Corrigendum 1; 2001; 23 Pages.
IEEE Std 802.11b-1999/ Cor 1-2001; IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 2: Higher-Speed Physical Layer (PHY) extension in the 2.4 GHz Band—Corrigendum 1; IEEE Computer Society; Sponsored by the LAN/MAN Standards Committee; Nov. 7, 2001; 23 pages.
IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1053 pages.
IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.
International Search Report and Written Opinion for PCT Application No. PCT/US2015/028867 dated Jul. 13, 2015; 10 pages.
Kiran Gunnam et al.; "Multi-Rate Layered Decoder Architecture for Block LDPC Codes of the IEEE 802.11n Wireless Standard"; 2007; pp. 1645-1648.
Rolf de Vegt; IEEE 802.11ax Selection Procedure (Draft); Jul. 2014; 117 pages.
Taeho Kgil and Trevor Mudge; "FlashCache: A NAND Flash Memory File Cache for Low Power Web Serviers"; Advanced Computer Architecture Laboratory; The University of Michigan, Ann Arbor, USA; 2006; 13 pages.
Taeho Kgil and Trevor N. Mudge; "FlashCache: A NAND flash memory file cache for low power web servers"; ResearchGate; Jan. 2006; 11 pages.

* cited by examiner

METHOD AND APPARATUS FOR CACHING DATA IN AN SOLID STATE DISK (SSD) OF A HYBRID DRIVE THAT INCLUDES THE SSD AND A HARD DISK DRIVE (HDD)

CROSS-REFERENCE TO RELATED APPLICATIONS

This application is a continuation of U.S. application Ser. No. 15/676,395, filed Aug. 14, 2017, which is a continuation of U.S. application Ser. No. 15/204,368 (now U.S. Pat. No. 9,733,841), filed on Jul. 7, 2016, which is a continuation of U.S. application Ser. No. 14/702,078 (now U.S. Pat. No. 9,454,991), filed May 1, 2015, which claims the benefit of U.S. Provisional Application No. 61/987,947, filed on May 2, 2014. This application is related to U.S. patent application Ser. No. 14/519,826, filed on Oct. 21, 2014, which claims the benefit of U.S. Provisional Application No. 61/893,662, filed on Oct. 21, 2013, U.S. Provisional Application No. 61/893,675, filed on Oct. 21, 2013, and U.S. Provisional Application No. 61/893,683, filed on Oct. 21, 2013, and U.S. Provisional Application No. 61/895,049, filed Oct. 24, 2013. The entire disclosures of the above applications are incorporated herein by reference.

FIELD

The present disclosure relates generally to storage devices and more particularly to caching systems and methods for hard disk drives and hybrid drives.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Figure 1:
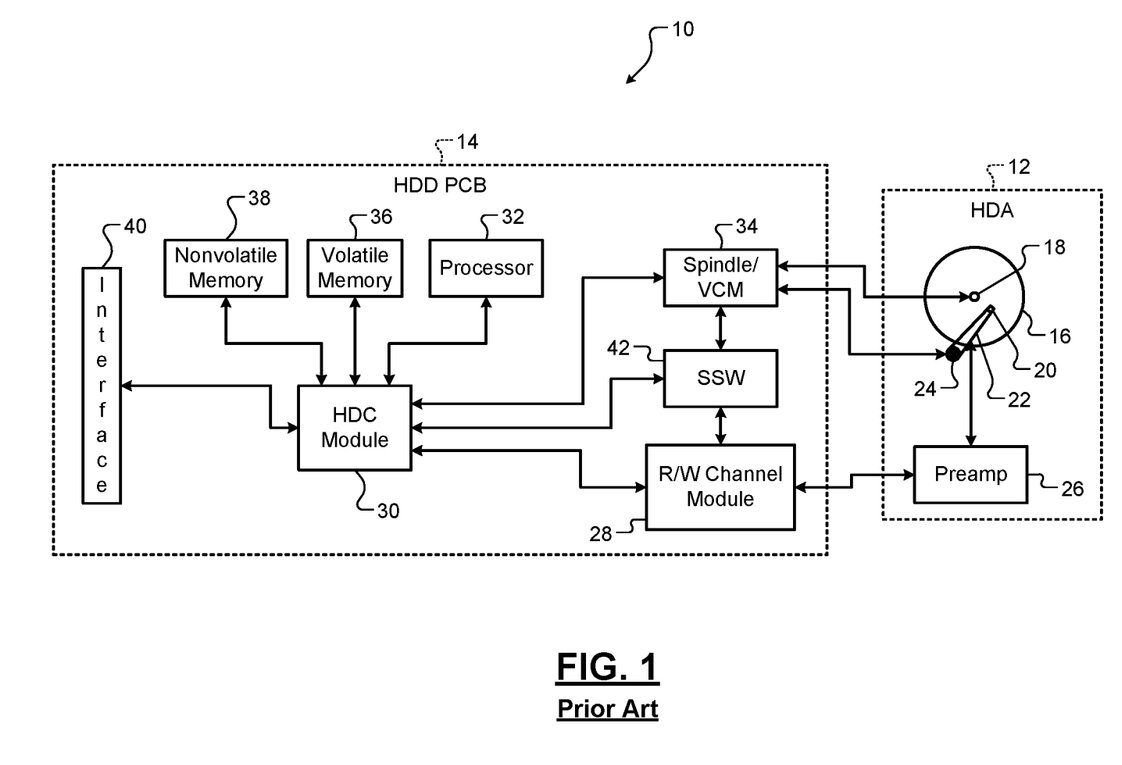
FIG. 1 is a functional block diagram of a hard disk drive (HDD) according to the prior art.

FIG. 1 shows a hard disk drive (HDD) 10 includes a hard disk assembly (HDA) 12 and a HDD printed circuit board (PCB) 14. The HDA 12 includes one or more circular platters 16, which have magnetic surfaces that are used to store data magnetically. Data is stored in binary form as a magnetic field of either positive or negative polarity. The platters 16 are arranged in a stack, and the stack is rotated by a spindle motor 18. At least one read/write head (hereinafter, "head") 20 reads data from and writes data on the magnetic surfaces of the platters 16.

Each head 20 includes a write element, such as an inductor, that generates a magnetic field and a read element, such as a magneto-resistive (MR) element, that senses the magnetic field on the platter 16. The head 20 is mounted at a distal end of an actuator arm 22. An actuator, such as a voice coil motor (VCM) 24, moves the actuator arm 22 relative to the platters 16.

The HDA 12 includes a preamplifier device 26 that amplifies signals received from and sent to the head 20. When writing data, the preamplifier device 26 generates a write current that flows through the write element of the head 20. The write current is switched to produce a positive or negative magnetic field on the magnetic surfaces of the platters 16. When reading data, the magnetic fields stored on the magnetic surfaces of the platters 16 induce low-level analog signals in the read element of the head 20. The preamplifier device 26 amplifies the low-level analog signals and outputs amplified analog signals to a read/write (R/W) channel (hereinafter, "read-channel") module 28.

The HDD PCB 14 includes the read-channel module 28, a hard disk controller (HDC) module 30, a processor 32, a spindle/VCM driver module 34, volatile memory 36, non-volatile memory 38, and an input/output (I/O) interface 40. During write operations, the read-channel module 28 may encode the data to increase reliability by using error-correcting codes (ECC) such as run length limited (RLL) code, Reed-Solomon code, etc. The read-channel module 28 then transmits the encoded data to the preamplifier device 26. During read operations, the read-channel module 28 receives analog signals from the preamplifier device 26. The read-channel module 28 converts the analog signals into digital signals, which are decoded to recover the original data.

The HDC module 30 controls operation of the HDD 10. For example, the HDC module 30 generates commands that control the speed of the spindle motor 18 and the movement of the actuator arm 22. The spindle/VCM driver module 34 implements the commands and generates control signals that control the speed of the spindle motor 18 and the positioning of the actuator arm 22. Additionally, the HDC module 30 communicates with an external device (not shown), such as a host adapter within a host device, via the I/O interface 40. The HDC module 30 may receive data to be stored from the external device, and may transmit retrieved data to the external device.

The processor 32 processes data, including encoding, decoding, filtering, and/or formatting. Additionally, the processor 32 processes servo or positioning information to position the heads 20 over the platters 16 during read/write operations. Servo, which is stored on the platters 16, ensures that data is written to and read from correct locations on the platters 16. In some implementations, a self-servo write (SSW) module 42 may write servo on the platters 16 using the heads 20 prior to storing data on the HDD 10.

To increase the storage capacity of the HDD, shingled magnetic recording (SMR) can be used to write data in tracks that partially overlap like shingles on a roof. Data is written in shingled tracks using a write head that is wider than the read head. Non-overlapping portions of the shingled tracks are narrower than the width of the write head. The data written in the shingled tracks is read back by the narrower read head. The shingled tracks increase data density, which increases the storage capacity of the HDD.

The shingled tracks may be grouped as bands that are separated by inter-band gaps or guard bands. Depending on the application, tracks on an entire platter of a HDD may be organized as a single band. Data is written to an entire band at a time. Accordingly, when a portion of data in a band needs to be modified (e.g., corrected or updated), a read-modify-write operation is performed. Specifically, all data in a band is first read and stored in memory. The relevant portion of the data stored in memory is then modified (e.g., corrected or updated) with new data. The entire data, including the modified portion or portions, is then written back to the band.

SUMMARY

A system comprises a read/write module and a caching module. The read/write module is configured to access a first portion of a recording surface of a rotating storage device. Data is stored on the first portion of the recording surface of the rotating storage device at a first density. The caching module is configured to cache data on a second portion of the recording surface of the rotating storage device at a second density. The second portion of the recording surface of the rotating storage device is separate from the first portion of the recording surface of the rotating storage device. The second density is less than the first density.

In other features, the second portion of the recording surface of the rotating storage device includes a plurality of tracks. Each track of the plurality of tracks stores $2^N$ cache lines. N is an integer greater than or equal to zero. A size of each of the cache lines is greater than or equal to one megabyte.

In other features, the first portion of the recording surface of the rotating storage device is adjacent to an inner diameter of the rotating storage device. The second portion of the recording surface of the rotating storage device is adjacent to an outer diameter of the rotating storage device.

In another feature, the second portion of the recording surface of the rotating storage device has a lower track density than the first portion of the recording surface of the rotating storage device.

In other features, the read/write module is configured to store data on the first portion of the recording surface of the rotating storage device at the first density using a first recording format. The caching module is configured to cache data on the second portion of the recording surface of the rotating storage device at the second density using a second recording format that is different than the first recording format.

In other features, the caching module includes a final level cache module configured to receive a request for data from a host, lookup a hash table for an entry corresponding to the data, and retrieve the data from (i) the second portion of the recording surface of the rotating storage device in response to finding the entry in the hash table or (ii) the first portion of the recording surface of the rotating storage device in response to not finding the entry in the hash table.

In other features, the system further comprises a semiconductor memory. The semiconductor memory is selected from a group consisting of magneto-resistive random access memory, flash memory, and dynamic random access memory. The caching module is configured to use the semiconductor memory as a first level (L1) cache, and use the second portion of the recording surface of the rotating storage device as a second level (L2) cache.

In another feature, the read/write module is configured to read data stored in one of a plurality of tracks of the second portion of the recording surface of the rotating storage device before a read element of the rotating storage device settles on the one of the plurality of tracks.

In other features, the caching module is configured to cache data on the second portion of the recording surface of the rotating storage device using fully set associative caching. The system further comprises a content-addressable memory configured to store hash tables corresponding to the fully set associative caching. The content-addressable memory is implemented using dynamic random access memory.

In other features, the rotating storage device includes a hard disk drive. The hard disk drive includes one or more platters. The hard disk drive is configured to store greater than or equal to one terabytes of data on each of the platters at the first density using shingled magnetic recording.

In further features, the read/write module is configured to read the data from the first portion of the recording surface of the rotating storage device following each write operation performed on the first portion of the recording surface of the rotating storage device. In response to detecting an error in reading the data from the first portion of the recording surface of the rotating storage device, the read/write module is configured to rewrite the data from the second portion of the recording surface of the rotating storage device to the first portion of the recording surface of the rotating storage device.

In still other features, a method comprises storing data on a first portion of a recording surface of a rotating storage device at a first density, and caching data on a second portion of the recording surface of the rotating storage device at a second density. The second portion of the recording surface of the rotating storage device is separate from the first portion of the recording surface of the rotating storage device. The second density is less than the first density.

In other features, the method further comprises selecting a plurality of tracks on the second portion of the recording surface of the rotating storage device; and storing $2^N$ cache lines in each track of the plurality of tracks, where N is an integer greater than or equal to zero.

In another feature, the method further comprises selecting a size of each of the cache lines equal to or greater than one megabyte.

In other features, the method further comprises selecting the first portion of the recording surface of the rotating storage device adjacent to an inner diameter of the rotating storage device, and selecting the second portion of the recording surface of the rotating storage device adjacent to an outer diameter of the rotating storage device.

In another feature, the method further comprises selecting the second portion of the recording surface of the rotating storage device having a lower track density than the first portion of the recording surface of the rotating storage device.

In other features, the method further comprises storing data on the first portion of the recording surface of the rotating storage device at the first density using a first recording format, and caching data on the second portion of the recording surface of the rotating storage device at the second density using a second recording format that is different than the first recording format.

In other features, the method further comprises receive a request for data from a host, and looking up a hash table for an entry corresponding to the data. The method further comprises retrieving the data from (i) the second portion of the recording surface of the rotating storage device in response to finding the entry in the hash table or (ii) the first portion of the recording surface of the rotating storage device in response to not finding the entry in the hash table.

In other features, the method further comprises selecting a semiconductor memory from a group consisting of magneto-resistive random access memory, flash memory, and dynamic random access memory; using the semiconductor memory as a first level (L1) cache; and using the second portion of the recording surface of the rotating storage device as a second level (L2) cache.

In another feature, the method further comprises reading data stored in one of a plurality of tracks of the second portion of the recording surface of the rotating storage device before a read element of the rotating storage device settles on the one of the plurality of tracks.

In other features, the method further comprises caching data on the second portion of the recording surface of the rotating storage device using fully set associative caching; storing, in a content-addressable memory, hash tables corresponding to the fully set associative caching; and implementing the content-addressable memory using dynamic random access memory.

In other features, the rotating storage device includes a hard disk drive having one or more platters, and the method further comprises storing greater than or equal to one terabytes of data per platter on the hard disk drive using shingled magnetic recording.

In other features, the method further comprises reading the data from the first portion of the recording surface of the rotating storage device following each write operation performed on the first portion of the recording surface of the rotating storage device. The method further comprises, in response to detecting an error in reading the data from the first portion of the recording surface of the rotating storage device, rewriting the data from the second portion of the recording surface of the rotating storage device to the first portion of the recording surface of the rotating storage device.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure proposes systems and methods for hierarchically caching data on hard disk drives (HDDs). The HDDs may store data at a first (high) density on a first portion of a recording surface of the HDD (e.g., using shingled magnetic recording (SMR)). The HDDs may cache data at a second (low) density on a second portion of the recording surface of the HDD (e.g., without using SMR). For example, data may be stored at the first (high) density in shingled tracks in the first portion, and data may be cached on a plurality of non-shingled tracks in the second portion.

Throughout the present disclosure, SMR is used only as an illustrative example of a high-density data recording technique or format. Alternatively, any other data recording technique or format may be used instead. In general, the number of tracks per inch may be greater in the first portion (high density, data portion) of the recording surface than in the second portion (low density, cache portion) of the recording surface. Alternatively or additionally, the data density (e.g., sectors per track and/or bytes per sector) may be greater in the first portion (data portion) of the recording surface than in the second portion (cache portion) of the recording surface. Accordingly, the first (high) density and second (low) density may respectively indicate a first (high) number of tracks per inch in the first portion (data portion) of the recording surface and a second (low) number of tracks per inch in the second portion (cache portion) of the recording surface. Alternatively or additionally, the first (high) density and second (low) density may respectively indicate a first (high) number of sectors per track and/or bytes per sector in the first portion (data portion) of the recording surface and a second (low) number of sectors per track and/or bytes per sector in the second portion (cache portion) of the recording surface.

A cache line size is selected such that a predetermined number of cache lines (e.g., $2^N$ cache lines, where N is an integer greater than or equal to zero) can be stored in each non-shingled track to simplify computations performed by caching algorithms used to cache data on the non-shingled tracks. For example, the cache line size can be at least one megabyte (MB) and can be tens of megabytes. The track density (i.e., tracks per inch or TPI) of the non-shingled tracks can be relaxed so as to avoid inter-track interference (ITI) while more shingled tracks than normal can be packed per inch to further increase the total storage capacity of the HDD. Read/write operations on the non-shingled tracks can be performed without waiting for the read/write heads to settle on the non-shingled tracks, which improves access times. Read operations are performed after each write operation performed on the shingled tracks, and data cached in the non-shingled track is used to rewrite the data on the shingled tracks if an error is detected during a read operation. A semiconductor cache can be added as L1 cache, in which case the cache comprising the non-shingled tracks (called disk cache or HDD cache) is used as L2 cache. Capacities of each of the L1 and L2 caches can be very small compared to the total storage capacity of the HDD (e.g., approximately 1% of the total storage capacity of the HDD).

More specifically, the present disclosure proposes caching systems and methods for pure HDDs as well as hybrid drives comprising HDDs and solid-state disks (SSDs). For hybrid drives, the caching systems and methods may use a very small capacity SSD (e.g., 8 Gigabytes (GB) or 16 GB) to cache data that is written to and read from extremely high-capacity HDDs (e.g., HDDs having storage capacities from 512 GB to tens of terabytes (TBs)). Similar caching systems and methods may be used for pure HDDs (i.e., HDDs that do not use SSDs to cache data) that stored data using SMR, which significantly increases the storage capacities of the HDDs. In pure HDDs using SMR, a small amount of the HDD storage (i.e., a small portion of the HDD) that stores data in the traditional format (i.e., non-shingled format) can be allocated for caching (i.e., to allow cache data to be written randomly). The track density (i.e., tracks per inch or TPI) of the non-shingled tracks in the caching portion of the HDD can be relaxed (i.e., the non-shingled tracks can be spaced farther apart) to eliminate inter-track interference (ITI), which allows very fast head settling times and reduces read error rates to almost negligible levels (practically eliminating retries).

In either case, due to the relatively small cache capacity, the cache hit rates need to approach 99.99%. For hybrid drives, the high cache hit rates effectively make the devices look like pure SSDs. In fact, from a user point of view, the system will report the overall HDD size as the size of the SSD (or the HDD cache). To reach 99.99% cache hit rate, a final level cache (FLC, also called last level cache or LLC), which is typically used in a processor subsystem (e.g., a system-on-chip (SOC)), can be adapted for the HDD environment. Specifically, the cache line size can be increased from kilobytes (KBs) to megabytes (MBs) since in HDD caching, head positioning takes a nontrivial amount of time (milliseconds), and increasing the cache line size reduces the need to reposition the head on multiple tracks. Further, since PC benchmarks may have random read/writes as well as sequential read/writes to any locations, the cache line size may be a multiple of the capacity of a track. For example, the cache line size may be a multiple of power of two to simplify caching algorithm implementation, which may be achieved by selecting a proper band of tracks on the HDD.

For the SSDs, while the constraints associated with the HDDs (e.g., head settling time) are absent, the cache line size can still be increased since the FLC is a fully set associative cache and would require a gigantic amount of content-addressable memory (CAM) or hash table if a small cache line size is chosen instead. For example, a cache line size of 8 KB would require one million entries, which can be cost prohibitive. Instead, by increasing the cache line size, the number of entries can be limited to no more than tens of thousands of entries similar to the FLC in the processor subsystems.

For example, consider a cache line of size 1 MB. Suppose 1-2% of HDD capacity is allocated as disk cache. If the HDD capacity is 8 TB, 1-2% of 8 TB is 80-160 GB. The number of entries in the hash table will be 80-160 GB divided by 1 MB, which is 80K-160K entries. SRAM would be very expensive to store a hash table of such size. Therefore, DRAM may be used instead to store the hash table.

In hybrid drives and pure HDDs, the hash tables for implementing the CAM can be stored in a DRAM instead of an on-chip SRAM since the access times of the HDDs and SSDs are much longer (i.e., slower) than the access times of the DRAM. Using DRAM also allows implementing the FLC at almost no cost on the SOC side since the SOCs typically include DRAM.

The caching systems and methods of the present disclosure provide many benefits. For example, since the track pitch in the cache area is relaxed, it is not necessary to wait until the head fully settles at least during read operations, which further shortens the access times. Additionally, in the shingled area (i.e., the main HDD storage area), the track pitch can be squeezed (i.e., more shingled tracks can be packed per inch) to the point of read failure limit instead of write failure limit for the main HDD storage. The track pitch of the shingled tracks can be reduced because using the above caching systems and methods, read operations can be performed for every write operation performed on the shingled tracks to verify whether data is written correctly on the shingled tracks. If a read error occurs during a read operation performed following a write operation, the data can be re-written from the data cached in the non-shingled tracks to the shingled tracks.

Besides, most of the write operations can be performed on the HDD in the background, which the user does not notice. As far as the user is concerned, the device gives instant response to read and write commands. The only time the user may notice any delay is when the user performs an extremely large sequential write operation such as writing multiple full high-definition (HD) movie content. This, however, is a nonissue nowadays since the slowest HDDs are orders of magnitude faster than the Internet bandwidth. These and other features of the caching systems of the present disclosure are described below in detail.

Figure 2:
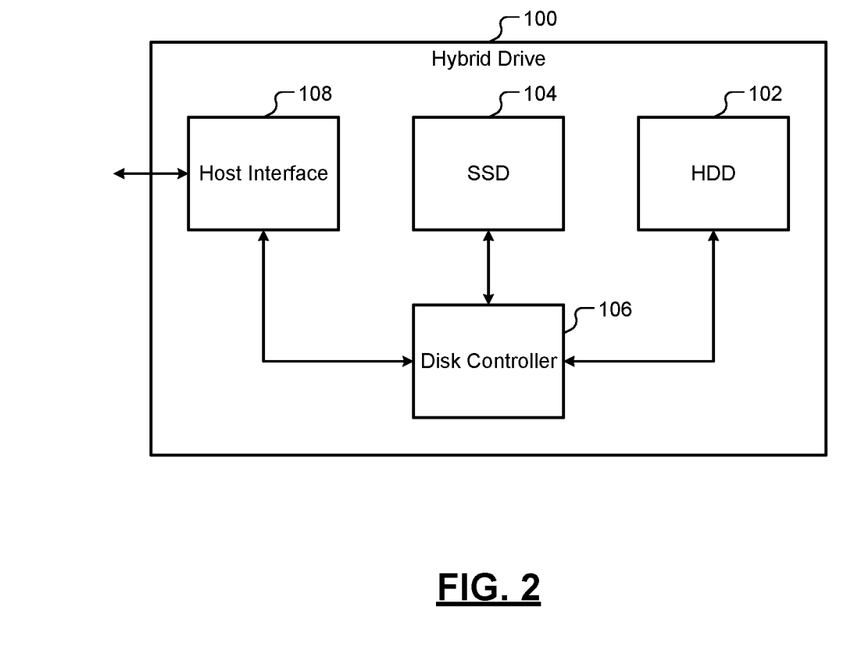
FIG. 2 is a functional block diagram of a hybrid drive comprising a HDD and a solid-state disk (SSD) used as cache according to the present disclosure.

FIG. 2 shows a hybrid drive 100. The hybrid drive 100 comprises a hard disk drive (HDD) 102, a solid-state disk (SSD) 104, a disk controller 106, and a host interface 108. The host interface 108 interfaces the hybrid drive 100 to a host (not shown). The disk controller 106 controls the HDD 102 and the SSD 104. The SSD 104 is used to cache data. The disk controller 106 uses the SSD 104 to cache the data.

The capacity of the SSD 104 is typically very small relative to the capacity of the HDD 102. For example, the capacity of the SSD 104 may be 8 GB to 16 GB while the capacity of the HDD 102 may be 512 GB to 1 TB or 2 TB. Thus, the ratio of the capacity of the SSD 104 to the capacity of the HDD 102 may be, for example, 8 GB to 512 GB or 1:64; or 8 GB to 1 TB or 1:128. That is, the capacity of the SSD 104 may be approximately 1% of the capacity of the HDD 102.

Figure 3A:
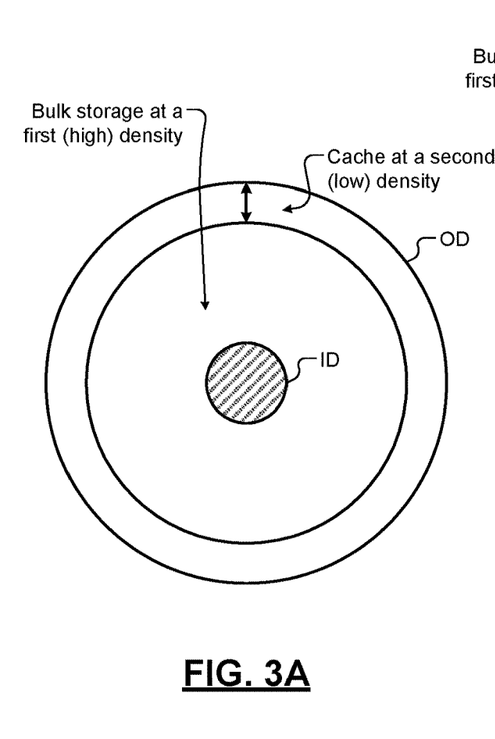
FIGS. 3A-3C depict different arrangements of storing data at a first (high) density and caching data at a second (low) density on an HDD according to the present disclosure.
Figure 3B:
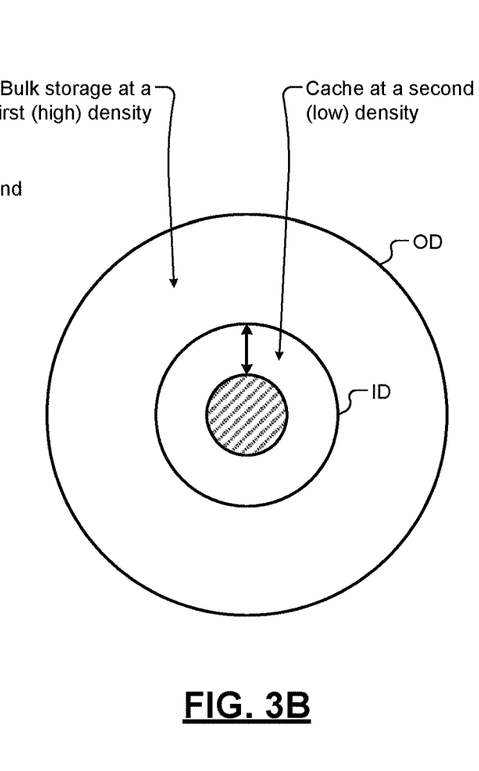
Figure 3C:
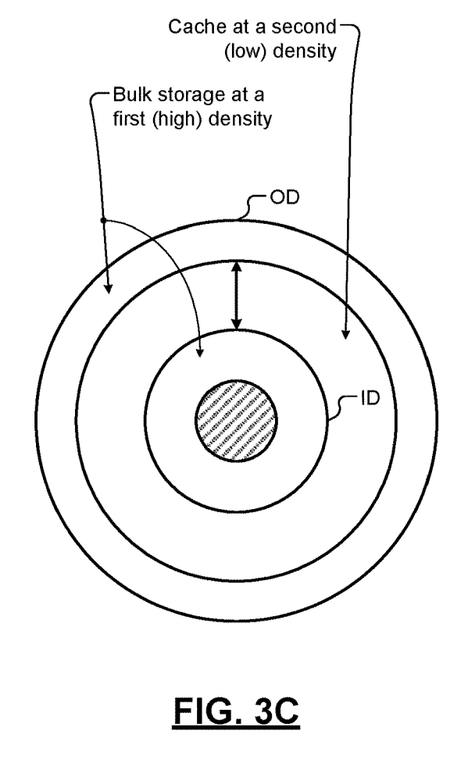

FIGS. 3A-3C show examples of using non-shingled tracks for caching data in a pure HDD (i.e., an HDD without an SSD) according to the present disclosure. Specifically, a first (high density) portion of the HDD is used as bulk storage, and a second (low density) portion of the HDD itself is used as cache. While only a single platter (i.e., recording surface) of an HDD is shown, the systems and methods described below can be extended to other platters (i.e., recording surfaces) of the HDD as well.

The first and second portions may be arranged in different ways. Each platter of the HDD has an outer diameter (OD) and an inner diameter (ID). The non-shingled tracks used to store cache data may be located anywhere on the platter. For example, in FIG. 3A, the non-shingled tracks used to store cache data are located closer to the outer diameter of the platter while the rest of the tracks on the platter are shingled and are used to store regular data using SMR. In FIG. 3B, the non-shingled tracks used to store cache data are located closer to the inner diameter of the platter while the rest of the tracks on the platter are shingled and are used to store regular data using SMR. In FIG. 3C, the shingled tracks used to store data using SMR are located in areas closer to the outer diameter and the inner diameter of the platter while the non-shingled tracks used to store cache data are located between the areas comprising the shingled tracks. Many other arrangements of the non-shingled tracks and shingled tracks, including combinations of one or more arrangements shown in FIGS. 3A to 3C, are contemplated.

For example only, the HDD shown may use shingled magnetic recording (SMR) to store data in shingled tracks. A selected number of non-shingled tracks on a platter of the HDD can be used to cache data. Unlike the data that is stored in the shingled tracks using SMR, the cache data is stored in the selected non-shingled tracks without using SMR. Instead, the cache data is stored in the selected non-shingled tracks in a conventional manner (i.e., without using SMR or by using data recording techniques other than SMR). Accordingly, unlike the shingled tracks that are used to store data using SMR, the non-shingled tracks used to store cache data do not use SMR to store cache data. Instead, the non-shingled tracks use a conventional data recording technique other than SMR to store cache data. Since the non-shingled tracks cache data on the disk, the non-shingled tracks used to cache data may also be referred to as disk cache or HDD cache.

The non-shingled tracks used to store cache data can be spaced far apart (e.g., may be separated by a predetermined distance) so as to not cause inter-track interference (ITI). In other words, the track density (i.e., tracks per inch or TPI) of the non-shingled tracks used to store cache data can be significantly less than the track density of the shingled tracks used to store regular data using SMR. The track density of the non-shingled tracks used to store cache data can also be significantly less than the track density of conventional HDDs that do not use SMR to store data. The total capacity of the non-shingled tracks used to store cache data is very small relative to the total capacity of the HDD. For example, the total storage capacity of the non-shingled tracks maybe approximately 1% of the total storage capacity of the HDD.

The first (high density) portion stores bulk data at a high density. Read/write operations performed on the first (high density) portion use most complex signal processing to process the data stored on the first (high density) portion. Such processors consume high power and use a large die size. However, such complexity can be traded off for slower performance. Further, the first (high density) portion may be rarely accessed if the disk cache (i.e., the second (low density) portion) has a low miss rate (e.g., 1% miss rate; i.e., 99% hit rate).

The second (low density) portion caches data at a low density, which is easy to recover. Read/write operations performed on the second (low density) portion use low complexity signal processing and low power to process the data stored on the second (low density) portion. Since the second (low density) portion is typically located near the outer diameter (OD) of the platter (recording surface) as shown in FIG. 3A, the data rate and performance are highest. Further, the second (low density) portion is accessed very often since the disk cache (i.e., the second (low density) portion) has a high hit rate (e.g., 99% hit rate; i.e., 1% miss rate). Cache is a snap shot of the overall bulk storage. To get high hit rate, FLC is used as explained above. Without FLC, hit rates could be less than 50% resulting in bad performance.

Figure 4A:
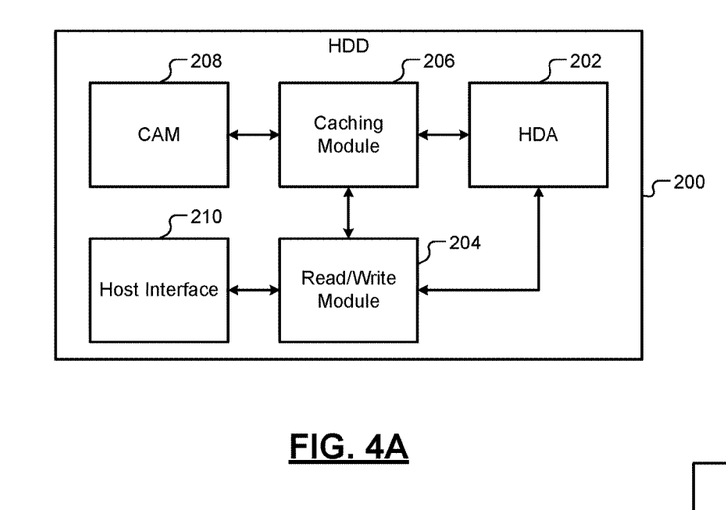
FIG. 4A is a functional block diagram of an HDD that stores data at the first (high) density and caches data at the second (low) density according to the present disclosure.

FIG. 4A shows an example of a pure HDD 200 according to the present disclosure. The HDD 200 comprises a hard disk assembly (HDA) 202, a read/write module 204, a caching module 206, a content addressable memory (CAM) 208, and a host interface 210. The HDA 202 may include one or more platters. The one or more platters may include one or more arrangements of shingled and non-shingled tracks shown in FIGS. 3A-3C or any other arrangements of shingled and non-shingled tracks.

The read/write module 204 communicates with the host interface 210 and reads and writes data from and to shingled tracks on the HDA 202 using SMR. The caching module 206 communicates with the read/write module 204 and the HDA 202 and caches data (i.e., reads and writes cache data) to non-shingled tracks on one or more platters of the HDA 202 without using SMR. In some implementations, the read/write module 204 may also read and write cache data from and to the non-shingled tracks on the one or more platters of the HDA 202 without using SMR.

The caching module 206 implements a fully set associative caching algorithm and stores corresponding hashing tables in the CAM 208. For example, the CAM 208 may be implemented using a dynamic random access memory (DRAM) since the access time of the DRAM is faster than the access time of the HDD.

The caching module 206 selects a size of each cache line. For example, suppose that a cache capacity of 8 GB using the non-shingled tracks is desired. The caching module 206 divides the cache capacity of 8 GB by 8K cache lines yielding 1 MB as the size for each cache line. In general, the size of each cache line may be at least 1 MB. For example, the size of each cache line may be tens of megabytes.

The storage capacity of the non-shingled tracks used to store cache data depends on the radii of the non-shingled tracks. Accordingly, the storage capacity of the non-shingled tracks depends on the location of the non-shingled tracks on the platter. For example, the non-shingled tracks located near the outer diameter of the platter will have more storage capacity than the non-shingled tracks located near the inner diameter of the platter. Additionally, the non-shingled tracks located near the outer diameter of the platter will have a higher data rate (e.g., approximately twice the data rate) than the non-shingled tracks located near the inner diameter of the platter.

Accordingly, the caching module 206 may select the size of each cache line and/or the location of the non-shingled tracks used to store cache data such that an integer number of cache lines can fit into each of the non-shingled tracks. For example, the caching module 206 may select the size of each cache line and/or the location of the non-shingled tracks such that $2^N$ cache lines can fit into each of the non-shingled tracks, where N is an integer greater than or equal to zero. As compared to selecting any other number of cache lines per non-shingled track, selecting a binary number of cache lines per non-shingled track can simplify the computations performed by the caching algorithm executed by the caching module 206. The caching module 206 can therefore locate a band of non-shingled tracks that can satisfy the $2^N$ cache lines per non-shingled track relationship.

Ideally, the cache line size may be equal to the size of tracks. For example, the track size and the cache line size may be 1 MB. In this example, using 16K tracks as disk cache will yield a disk cache size of 16K*1 MB=16 GB.

In general, a size of a cache line is selected based on a desired cache size and the capacity of the HDD. For example, if the capacity of the HDD is 1 TB and if the desired cache size is approximately 1% of the capacity of the HDD (e.g., 8 GB), the size of the cache line can be selected as 1 MB, which is the cache size of 8 GB divided by a total of 8K cache lines. A band of non-shingled tracks on the HDD is selected, where the band of non-shingled tracks can store the total number of cache lines (e.g., 8K cache lines in the above example), and where each non-shingled track can store a predetermined number of cache lines. For example, each non-shingled track can store an integer number of cache lines, where the integer number may be a binary number $2^N$, where N is an integer greater than or equal to zero. For example, the selected band of non-shingled tracks may be located closer to the outer diameter or the inner diameter of the platter, or between two areas of shingled tracks on the platter. Further, the track density (i.e., tracks per inch or TPI) of the selected non-shingled tracks should be such that there will be no inter-track interference when performing read/write operations on any of the selected non-shingled tracks.

Data is cached on the selected non-shingled tracks at a low density (e.g., without using shingled magnetic recording (SMR)). In other words, during caching, read/write operations are performed on the selected non-shingled tracks in a conventional manner. During normal read/write operations to the HDD, data is written at high density to other shingled tracks using shingled magnetic recording (SMR), for example. Also, a read operation is performed after every write operation performed on the shingled tracks to verify that the data is written correctly on the shingled tracks. If an error occurs, data cached in the non-shingled tracks is used to rewrite the shingled tracks. Since write errors can be easily corrected as above, more shingled tracks than normal can be packed per inch on the platters of the HDD.

Since the non-shingled tracks are separated by a sufficient predetermined distance so as to not cause inter-track interference, the caching module 206 (or the read/write module 204) can read the cached data from the non-shingled tracks without waiting for the read head to fully settle on a given non-shingled track. That is, the caching module 206 (or the read/write module 204) can read the cached data from the non-shingled tracks without waiting for the settling time of the read head to elapse. Reading data without waiting for the settling time of the read head reduces the access time of read operations, which further improves performance of the caching system. Similarly, write operations to the non-shingled tracks can be performed without waiting for the write head to fully settle on a given track (i.e., without waiting for the settling time of the write head to elapse).

Due to the speed and accuracy of the above caching system, the shingled tracks can be packed closer together than normal, and each write operation to the shingled tracks can be verified by a subsequent read operation. If the read operation following a write operation indicates that data was written incorrectly due to the closely packed shingled tracks, the data can be quickly read from the data cached in the non-shingled tracks and can be rewritten on the shingled tracks without affecting adversely performance of the HDD 200.

Using a binary number of cache lines per non-shingled track and using fully set associative caching can provide better than 99.99% cache hit rates. Since the non-shingled tracks used to cache data use only approximately 1% of the total disk capacity and since more shingled tracks than normal can be packed on the platters of the HDD 200, the total storage capacity of the HDD 200 can be significantly increased. For example, the total storage capacity on the order of 1 TB per 2.5" platter can be achieved using the above caching system.

Figure 4B:
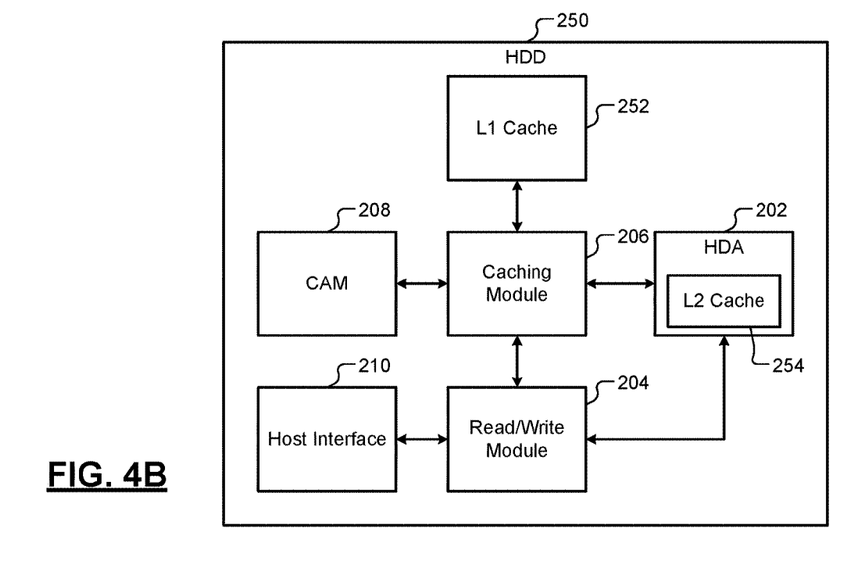
FIG. 4B is a functional block diagram of an HDD that stores data at the first (high) density in a first portion of the HDD, uses semiconductor memory as L1 cache, and uses a second portion of the HDD used to cache data at the second (low) density as L2 cache according to the present disclosure.

FIG. 4B shows an example of a HDD 250 according to the present disclosure. The HDD 250 comprises all of the components of the HDD 200 and additionally comprises a first-level (L1) cache 252. The L1 cache 252 can be implemented using a semiconductor memory. For example, the L1 cache can be implemented using one or more of magnetoresistive random access memory (MRAM), SSD (e.g., flash memory), DRAM, and so on. The disk cache including the selected non-shingled tracks of the HDD is used as L2 cache. Fully set associative caching is used when caching data to the L1 and L2 caches. Hash tables are stored in DRAM.

Similar to the HDD cache, the size of the L1 cache 252 can also be very small compared to the total disk capacity of the HDD 250. For example, the size of the L1 cache 252 can be 0.1% of the total disk capacity of the HDD 250. For example, the size of the L1 cache 252 can be 1 GB when the total disk capacity of the HDD 250 is 1 TB. Unlike the HDD cache, however, the cache line size of the L1 cache 252 can be traditional. For example, the cache lines of the L1 cache 252 can be in KBs (e.g., 8 KB, 16 KB, and so on). Alternatively, in some implementations, the size of the cache lines of the L1 cache 252 can be similar to the cache size of the HDD cache (e.g., greater than or equal to 1 MB).

In the HDD 250, the disk cache comprising the non-shingled tracks is utilized as a second-level (L2) cache 254. The size of the L2 cache 254 can still be the same (i.e., approximately 1% of the total disk capacity of the HDD 250; e.g., 8 GB or 16 GB if the capacity of the HDD 250 is 1 TB or 2 TB), while the size of the L1 cache 252 may be 1 GB, for example.

The L1 cache 252 is faster than the L2 cache 254 and can provide cache hit rates of approximately 99%. The L2 cache 254 is slower than the L1 cache 252 but faster than the shingled HDD 250 and can provide cache hit rates of greater than or equal to approximately 99.99%. Thus, a three-level caching storage system comprising an L1 semiconductor cache, an L2 disk cache (comprising non-shingled tracks), and the HDD (comprising shingled tracks, which can be considered as a third cache level) is contemplated.

Figure 5:
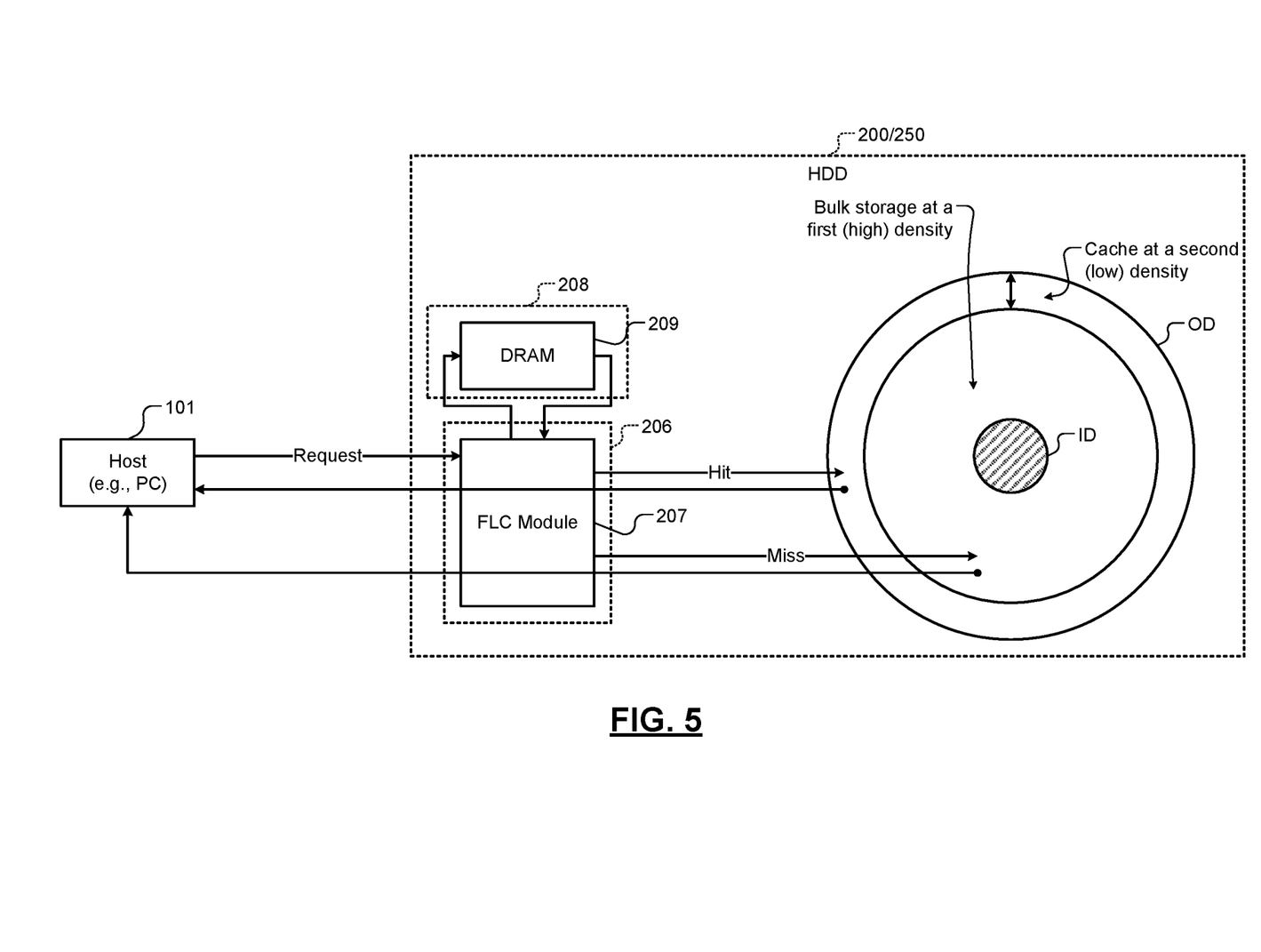
FIG. 5 shows a schematic, where a host (e.g., a PC) retrieves data from the HDD using the disk cache and Final Level Cache (FLC) according to the present disclosure.
Figure 6:
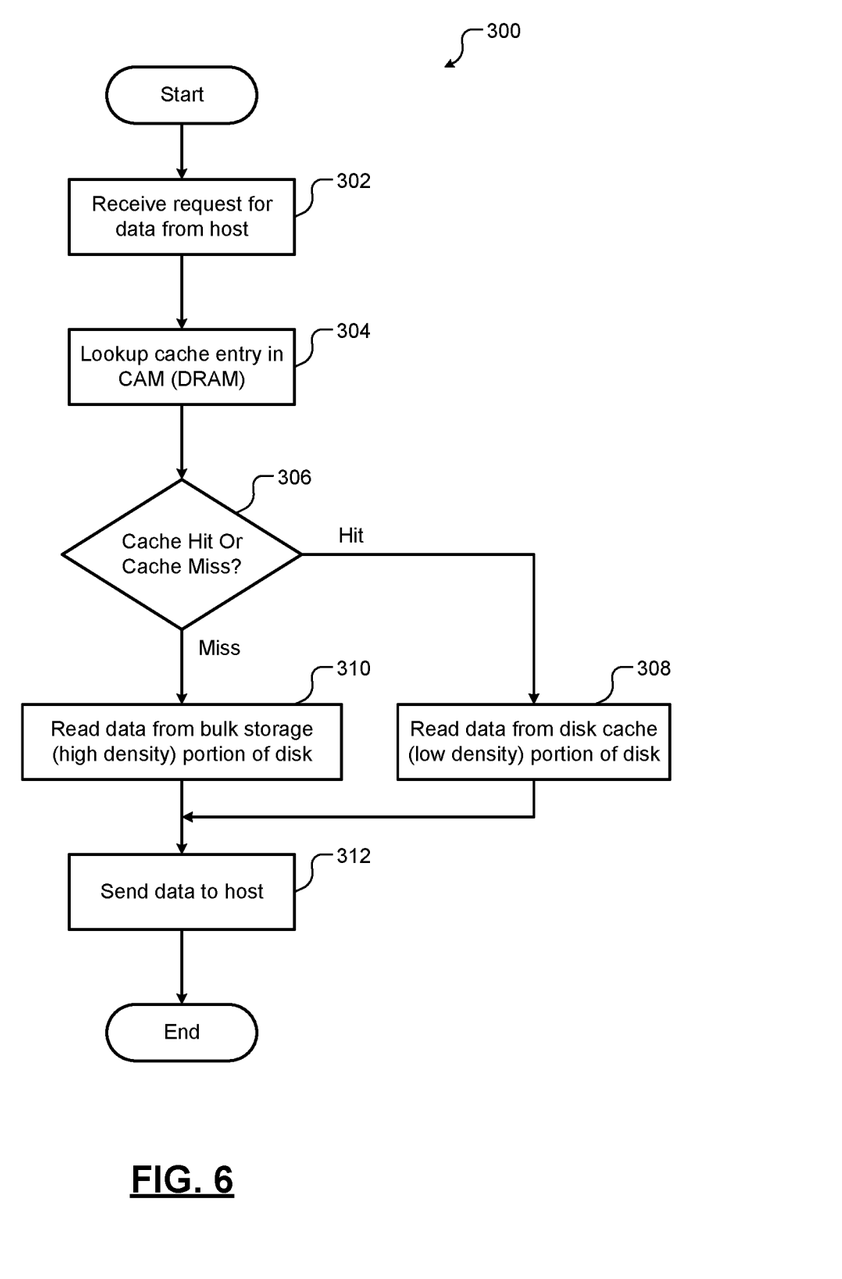
FIG. 6 shows a method used in FIG. 5 for retrieving data from the HDD using the disk cache and FLC according to the present disclosure.

FIGS. 5 and 6 show an example of retrieving data from the HDD 200/250 using the disk cache and FLC. FIG. 5 shows a schematic, where a host 101 (e.g., a PC) retrieves data from the HDD 200/250 using the disk cache and FLC. FIG. 6 shows a method 300 used in FIG. 5 for retrieving data from the HDD 200/250 using the disk cache and FLC. In FIG. 5, the caching module 206 includes a FLC module 207. The CAM module 208 includes DRAM 209. The data retrieval from the HDD 200/250 shown in FIG. 5 is explained below with reference to FIG. 6.

In FIG. 6, at 302, the FLC module 207 receives a request for data from the host 101. At 304, the FLC module 207 performs a lookup of cache entries in the DRAM 209. At 306, the FLC module 207 determines based on the lookup whether a cache hit or a cache miss occurred (i.e., whether a cache entry for the requested data was found (resulting in a cache hit) or not found (resulting in a cache miss) in a hash table stored in the DRAM 209). At 308, if a cache hit occurred, the FLC module 207 reads the requested data from the disk cache. At 310, if a cache miss occurred, the FLC module 207 reads the requested data from the bulk storage of the HDD. At 312, the FLC module 207 sends the requested data read from the HDD, either from the disk cache or from the bulk storage of the HDD, to the host 101. A detailed description of the FLC module 207 can be found in U.S. patent application Ser. No. 14/519,826, filed on Oct. 21, 2014, which is incorporated by reference in its entirety.

At least some of the following examples include final level cache (FLC) modules and storage drives. The FLC modules are used as virtual storage and the storage drives are used as physical storage. Data is first read from or written to the virtual storage prior to reading from or writing to the physical storage. Memory in the FLC modules and storage drives is referred to herein as content addressable memory (CAM). Control modules of the FLC modules control access to the memory in the FLC modules and the storage drives using various CAM techniques described below. The CAM techniques and other disclosed features reduce the required storage capability of the DRAM in a device while maximizing memory access rates and minimizing power consumption. The device may be a network device or a wireless network device. Examples of devices include but are not limited to a computer, a mobile phone, a tablet, a camera, etc. The DRAM in the following examples is generally not used as main memory, but rather is used as virtual memory and/or as a final level of cache.

One or more of the size of the cache lines; the number, locations, and track density of the non-shingled tracks; and the track density of the shingled tracks can be predetermined by the manufacturer. In some implementations, one or more of the size of the cache lines; the number, locations, and track density of the non-shingled tracks; and the track density of the shingled tracks can be predetermined by a consumer of the HDD.

The read/write module in the present disclosure may include a read channel (i.e., a read channel circuit or a read channel controller) of a HDD, which includes read/write circuits used to read and write data using read/write heads on one or more platters of an HDD. Accordingly, the "read/write module", "read module", and "write module" in the present disclosure can be respectively called the "read/write circuit", "read circuit", and "write circuit". Alternatively, the "read/write module", "read module", and "write module" in the present disclosure can be respectively called the "read/write controller", "read controller", and "write controller". Similarly, the caching module in the present disclosure may include a caching controller that executes a caching algorithm and that caches data to the L1 and L2 caches as described above. Accordingly, the "caching module" in the present disclosure can be called the "caching controller".

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. The functionality of any given module of the present disclosure may be distributed among multiple modules that are connected via interface circuits. For example, multiple modules may allow load balancing.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc.

The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. § 112(f) unless an element is expressly recited using the phrase "means for", or in the case of a method claim using the phrases "operation for" or "step for".

What is claimed is:

1. A hybrid drive comprising:
a storage system, wherein the storage system includes
a hard disk drive having a first data storage capacity, the hard disk drive including a data caching portion and a data storage portion, the data caching portion having a lower track density than the data storage portion; and
a solid state disk having a second data storage capacity, wherein the second data storage capacity of the solid state disk is lower than the first data storage capacity of the hard disk drive;
a host interface configured to be in communication with a host processor, the host processor including one or more levels of cache; and
a disk controller coupled to the storage system, wherein the disk controller is configured to access the solid state disk as a final level of cache prior to the disk controller accessing the hard disk drive, wherein in response to the host interface receiving a request for data that is not cached in the one or more levels of cache of the host processor, the disk controller is configured to determine first whether the data requested by the host processor is cached in the solid state disk being the final level of cache, and (i) retrieve, in response to determining the data requested by the host processor is cached in the solid state disk, the data requested by the host processor from the solid state disk, (ii) retrieve, in response to determining the data requested by the host processor is not cached in the solid state disk and is cached in the data caching portion of the hard disk drive, the data requested by the host processor from the data caching portion of the hard disk drive; and (iii) retrieve, in response to determining the data requested by the host processor is not cached in the solid state disk and is not cached in the data caching portion of the hard disk drive, the data requested by the host processor from the data storage portion of the hard disk drive.

2. The hybrid drive of claim 1, wherein the second data storage capacity of the solid state disk is a percentage of the first data storage capacity of the hard disk drive.

3. The hybrid drive of claim 2, wherein a cache line size within the solid state disk is a plurality of megabytes.

4. A network device comprising the hybrid drive of claim 1.

5. The network device of claim 4, wherein the network device comprises at least one of a mobile phone, a tablet, or a computer.

6. The hybrid drive of claim 1, wherein data is stored in the data caching portion and the data storage portion using different recording methods.

7. The hybrid drive of claim 1, wherein data is stored in the data storage portion using shingled magnetic recording and in the data caching portion using a recording method different than shingled magnetic recording (SMR).

* * * * *